United States Patent
Tanaka

(10) Patent No.: US 6,467,139 B1
(45) Date of Patent: Oct. 22, 2002

(54) MOUNTING STRUCTURE AND MOUNTING METHOD FOR SURFACE ACOUSTIC WAVE ELEMENT

(75) Inventor: Kei Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 09/614,145

(22) Filed: Jul. 11, 2000

Related U.S. Application Data

(62) Division of application No. 09/365,408, filed on Aug. 2, 1999, now abandoned.

(30) Foreign Application Priority Data

Aug. 3, 1998 (JP) .......................................... 10-218836

(51) Int. Cl.[7] ................................................ H05K 3/32
(52) U.S. Cl. .................... 29/25.35; 29/840; 310/313 R; 310/340
(58) Field of Search .............................. 29/25.35, 25.03, 29/424, 840, 594, 595, 609.1, 846, 872; 156/273; 360/313 R, 340, 344

(56) References Cited

U.S. PATENT DOCUMENTS

| | | | |
|---|---|---|---|
| 3,965,444 A | | 6/1976 | Willingham et al. |
| 4,243,960 A | | 1/1981 | White et al. |
| 4,267,480 A | | 5/1981 | Kanematsu et al. |
| 4,513,219 A | | 4/1985 | Katsume et al. |
| 5,247,220 A | | 9/1993 | Miyazawa et al. |
| 5,304,460 A | * | 4/1994 | Fulton et al. ................ 430/311 |
| 5,459,368 A | | 10/1995 | Onishi et al. |
| 5,502,891 A | * | 4/1996 | Mori et al. .................... 29/840 |
| 5,699,027 A | | 12/1997 | Tsuji et al. |
| 5,939,817 A | | 8/1999 | Takado |
| 6,025,669 A | | 2/2000 | Tanaka |
| 6,077,382 A | * | 6/2000 | Watanabe .................... 29/832 |
| 6,101,708 A | * | 8/2000 | Okano et al. ................. 29/832 |
| 6,284,086 B1 | * | 9/2001 | Cardellino ................... 156/273 |
| 6,300,782 B1 | * | 10/2001 | Hembree et al. ............. 29/874 |

FOREIGN PATENT DOCUMENTS

| | | | |
|---|---|---|---|
| EP | 93104821.9 | * | 3/1993 |
| EP | 0 794 616 A2 | | 9/1997 |
| EP | 0 896 427 A2 | | 2/1999 |
| GB | 2 297 424 A | | 8/1999 |
| GB | 2 334 618 A | | 8/1999 |
| JP | 4-150405 | | 5/1992 |
| JP | 7-86544 | | 3/1995 |
| JP | 7-99214 | | 4/1995 |
| JP | 8-307195 | | 11/1996 |
| JP | 8-316778 | | 11/1996 |
| JP | 9-162693 | | 6/1997 |
| JP | 9-232551 | | 9/1997 |
| JP | 10-22763 | | 1/1998 |
| JP | 10-107582 | | 4/1998 |
| JP | 10-135772 | | 5/1998 |
| JP | 10-190405 | | 7/1998 |

OTHER PUBLICATIONS

Japanese Office Action dated Jun. 6, 2001, with partial English translation.

* cited by examiner

Primary Examiner—Peter Vo
Assistant Examiner—Tai Nguyen
(74) Attorney, Agent, or Firm—McGinn & Gibb, PLLC

(57) ABSTRACT

A functional surface of a surface acoustic wave element is disposed to face a mount surface of a circuit board on which the surface acoustic wave element is to be mounted. A gap between the functional surface and the mount surface is sealed off by an anisotropic conductive resin while an oscillation space is maintained between an oscillation transmitting area of the functional surface and the mount surface. The oscillation space is constituted by a space that is formed by the anisotropic conductive resin. A mounting structure of the surface acoustic wave element is compact, is inexpensive, and has high reliability.

1 Claim, 3 Drawing Sheets

MOUNTING STRUCTURE AND MOUNTING METHOD FOR SURFACE ACOUSTIC WAVE ELEMENT

The present Application is a Divisional Application of U.S. patent application Ser. No. 09/365,408, filed on Aug. 2, 1999 now abandoned.

BACKGROUND OF THE INVENTION

1. Field of the Invention

The present invention relates to a surface acoustic wave element, and more particularly to a mounting structure and a mounting method for the surface acoustic wave element.

2. Description of the Related Art

As one example of conventional mounting structures and mounting methods of surface acoustic wave elements, Japanese Unexamined Patent Publication (JP-A) No. 150405/1992 discloses a flip-chip mounting structure and mounting method. FIGS. 1 and 2 show respectively the disclosed mounting structure and mounting method.

In the conventional mounting structure, a comb electrode 2 is formed by Al wiring on a functional surface 1a of a surface acoustic wave element 1, and Au bumps 25 are formed on connecting pads 4 of the surface acoustic wave element 1. The surface acoustic wave element 1 is disposed to face a mount surface 6a of a circuit board 6, and is electrically and mechanically connected to the circuit board 6. A silicone resin 26 having high viscosity is applied onto the surface acoustic wave element 1 by a dispenser and provides a coating to surround the surface acoustic wave element 1.

In the above conventional mounting structure of the surface acoustic wave element 1, since the silicone resin 26 covers an upper surface and periphery of the surface acoustic wave element 1, the mounting structure has an overall size greater than that of the surface acoustic wave element itself.

Also, the silicone resin 26 covers only the upper surface and periphery of the surface acoustic wave element 1, and an open space remains around the Au bumps 25 connecting the surface acoustic wave element 1 and board pads 7 on the circuit board 6. With such a structure, if the overall mounting structure is subjected to temperature changes repeatedly, stress is produced due to a difference in coefficient of thermal expansion between the surface acoustic wave element 1 and the circuit board 6 and directly impinges on joint portions of the Au bumps 25. Accordingly, the Au bumps 25 are susceptible to fatigue failure. The Au bumps 25 are also apt to break due to external impact, e.g., an impact caused in the event of being dropped.

Moreover, an epoxy resin and the like can be applied instead of the silicone resin 26 to cover the area around the surface acoustic wave element 1. Depending on viscosity of the resin applied, however, a difficulty is encountered in controlling the configuration of an oscillation space 9 defined between the surface acoustic wave element 1 and the circuit board 6. The reason is that the resin is forced to enter the oscillation space 9 by a capillary phenomenon and is deposited on an oscillation transmitting area of the functional surface 1a of the surface acoustic wave element 1. If such deposition of the resin occurs, desired characteristics of the surface acoustic wave element 1 are no longer obtained.

The conventional mounting method is carried out as shown in a flowchart in FIG. 2. First, the Au bumps 25 are formed on the functional surface 1a of the surface acoustic wave element 1 in the form of a wafer, i.e., on the connecting pads 4 which function as input/output terminals and a ground terminal (step S1) Then, the surface acoustic wave element 1 in the form of a wafer is subjected to dicing for separation into individual chips (step S2).

In a mounting step (step S3), the surface acoustic wave element 1 is mounted on the circuit board 6 so that the surface acoustic wave element 1 is positioned to face the mount surface 6a of the circuit board 6 with the functional surface 1a directed downward, and the metal bumps 25 on the surface acoustic wave element 1 are aligned with the board pads 7 on the circuit board 6.

Finally, the silicone resin 26 is applied to the backside of the surface acoustic wave element 1 (i.e., the side away from the functional surface 1a) (step S4). The mounting process is thereby completed.

The conventional mounting structure of the surface acoustic wave element 1 has the following problems.

First, the mounting structure has a size larger than that of the surface acoustic wave element. Accordingly, the surface acoustic wave element having the conventional mounting structure is not suitable for use in portable information equipment requiring electronics to be densely packed.

The above first problem is attributable to that surroundings of the surface acoustic wave element being covered by the silicone resin. The silicone resin functions to protect the surface acoustic wave element from the external environment and therefore cannot be omitted.

Secondly, in the conventional mounting structure, the silicone resin covers only the upper surface and periphery of the surface acoustic wave element, and an open space is left around the Au bumps connecting the surface acoustic wave element and the circuit board. Reliability, of connection is therefore low.

The above second problem is attributable to the situation that if the entire mounting structure is repeatedly subjected to temperature changes, stress is produced due to a difference in coefficient of thermal expansion between the surface acoustic wave element and the circuit board and is directly applied to the joint portions of the Au bumps. Accordingly, the Au bumps are susceptible to fatigue failure. The Au bumps are also apt to break due to external impact, e.g., an impact caused in the event of being dropped.

Thirdly, a difficulty is encountered in controlling the configuration of the oscillation space defined between the surface acoustic wave element and the circuit board depending on viscosity of the resin applied.

The above third problem is attributable to the situation that the resin is forced to enter the oscillation space by a capillary phenomenon and is deposited on the oscillation transmitting area of the functional surface of the surface acoustic wave element. If such deposition of the resin occurs, desired characteristics of the surface acoustic wave element are no longer obtained.

Additionally, similar mounting structures and mounting methods of surface acoustic wave elements are disclosed in Japanese Unexamined Patent Publications (JP-A) No. 307195/1996, No. 316778/1996, and No. 22763/1998.

SUMMARY OF THE INVENTION

An object of the present invention is therefore to provide a mounting structure of a surface acoustic wave element which is more compact.

Another object of the present invention is to provide a mounting structure of a surface acoustic wave element which is inexpensive and has high reliability.

In accordance with an aspect of the present invention, there is provided a mounting structure of a surface acoustic wave element in which a functional surface of the surface acoustic wave element is disposed to face a mount surface of a circuit board on which the surface acoustic wave element is to be mounted, and a gap between the functional surface and the mount surface is sealed off by a resin while an oscillation space is maintained between an oscillation transmitting area of the functional surface and the mount surface, wherein the resin is an anisotropic conductive resin, and the oscillation space is constituted by a space that is formed by the anisotropic conductive resin.

In accordance with another aspect of the present invention, there is provided a mounting method of a surface acoustic wave element in which a functional surface of the surface acoustic wave element is disposed to face a mount surface of a circuit board on which said surface acousitic wave element is to be mounted, and a gap between the functional surface and the mount surface is sealed off by a resin while an oscillation space is maintained between an oscillation transmitting area of the functional surface and the mount surface, the method comprising the steps of: placing an anisotropic conductive resin on the mount surface of the circuit board, the anisotropic conductive resin having a space serving as the oscillation space; positioning the functional surface of the surface acoustic wave element to face the mount surface of the circuit board in aligned relation; and connecting the surface acoustic wave element and the circuit board by heating the surface acoustic wave element to cure the anisotropic conductive resin while the surface acoustic wave element is pressed against the mount surface of the circuit board under pressure.

DESCRIPTION OF THE PREFERRED EMBODIMENTS

In a mounting structure of a surface acoustic wave element according to the present invention, a resin is filled in a gap between the periphery of an oscillation transmitting area of a functional surface of the surface acoustic wave element and a mount surface of a circuit board, on which the surface acoustic wave element is to be mounted, in a condition where the functional surface is positioned to face the mount surface while an oscillation space is maintained between the oscillation transmitting area of the functional surface and the mount surface.

Further, an anisotropic conductive resin is used as the resin that is filled in the gap between the periphery of the oscillation transmitting area of the functional surface and the mount surface while the oscillation space is maintained. The oscillation space is securely provided near the oscillation transmitting area of the functional surface by forming a sheet of the anisotropic conductive resin into a desired shape.

Preferred embodiments of the present invention will be described below in detail with reference to the drawings.

Figure 1:
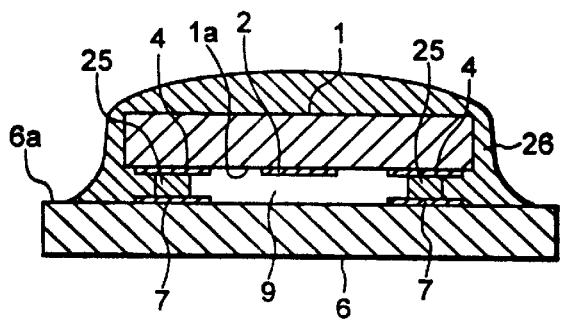
FIG. 1 is a sectional view showing one example of a conventional mounting structure of a surface acoustic wave element.
Figure 2:
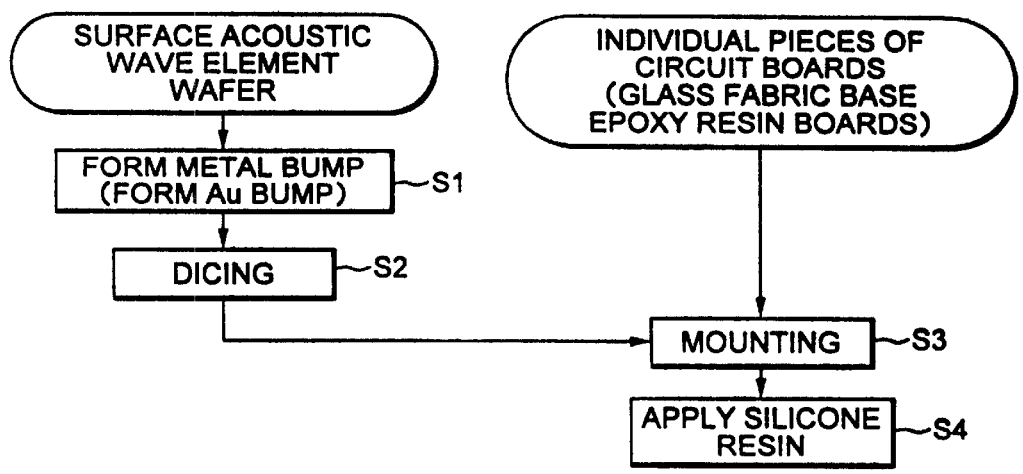
FIG. 2 is a flowchart of a mounting method of the surface acoustic wave element shown in FIG. 1.
Figure 3:
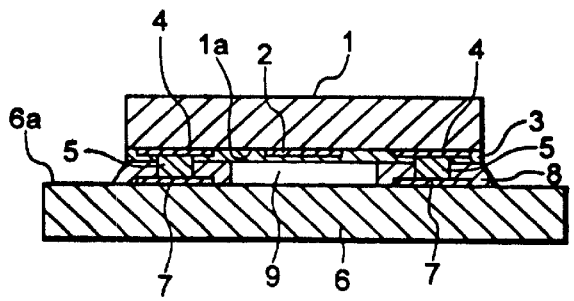
FIG. 3 is a sectional view of a mounting structure of a surface acoustic wave element according to a first embodiment of the present invention.

FIG. 3 is a sectional view of a mounting structure of a surface acoustic wave element according to a first embodiment of the present invention. Referring to FIG. 3, a comb electrode 2 is provided on a functional surface 1a of a surface acoustic wave element 1, and a protective film 3 is formed on the functional surface 1a, except for on connecting pads 4 on the functional surface 1a of the surface acoustic wave element 1. The connecting pads 4 on the functional surface 1a of the surface acoustic wave element 1 function as input/output terminals and a ground terminal. Metal bumps 5 are formed on the connecting pads 4.

An anisotropic conductive resin 8 fills a gap between the functional surface 1a of the surface acoustic wave element 1 and the mount surface 6a of the circuit board 6. The anisotropic conductive resin 8 is previously formed into such a shape as to leave a space near an oscillation transmitting area, including the comb electrode 2, of the functional surface 1a of the surface acoustic wave element 1. The space formed by the anisotropic conductive resin 8 serves as an oscillation space 9 to ensure characteristics of the surface acoustic wave element 1.

The surface acoustic wave element 1 is disposed with the functional surface 1a facing the mount surface 6a of the circuit board 6, and is electrically connected to board pads 7 on the mount surface 6a of the circuit board 6 through the metal bumps 5 and conductive (metal) particles (not shown) contained in the anisotropic conductive resin 8.

The anisotropic conductive resin 8 is in the form of a continuous frame surrounding the oscillation space 9, and is interposed between the surface acoustic wave element 1 and the circuit board 6. Also, the anisotropic conductive resin 8 covers the peripheries of the metal bumps 5.

Figure 4:
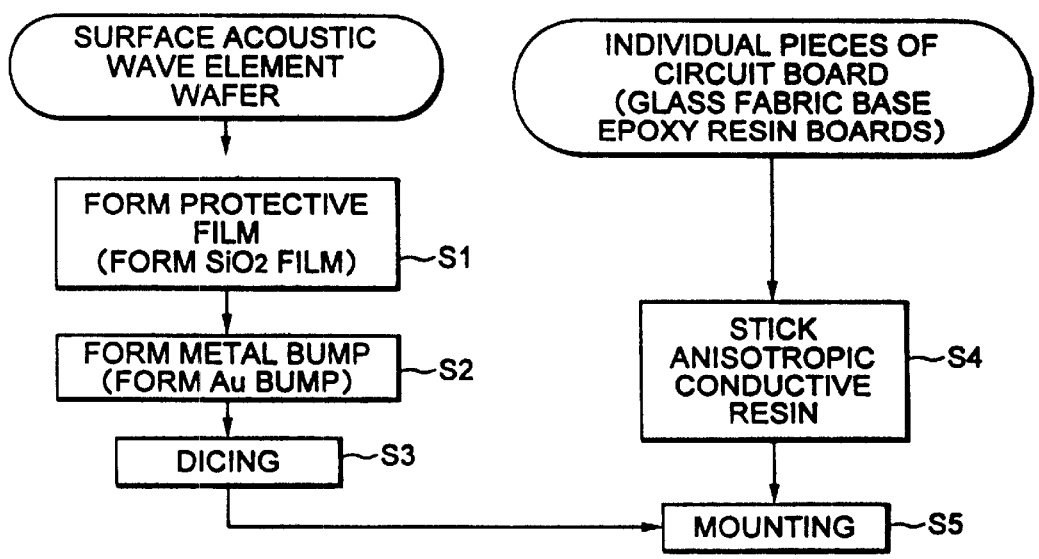
FIG. 4 is a flowchart of a mounting method of the surface acoustic wave element shown in FIG. 3.

FIG. 4 is a flowchart of a mounting method of the surface acoustic wave element shown in FIG. 3. Referring to FIG. 4, the protective film 3 is first formed on the functional surface 1a of the surface acoustic wave element 1 in the form of a wafer, except for on the connecting pads 4 (step S1). Then, the metal bumps 5 are formed on the connecting pads 4 by plating, wire bonding, bump transfer or the like, which are provided on the functional surface 1a of the surface acoustic wave element 1 and function as input/output terminals and a ground terminal (step S2).

Subsequently, the surface acoustic wave element 1 in the form of a wafer is subjected to dicing for separation into individual chips (step S3).

Next, a sheet of the anisotropic conductive resin 8 is adhered onto the mount surface 6a of the circuit board 6 at a mount position of the surface acoustic wave element 1 (step S4). The sheet of the anisotropic conductive resin 8 is machined to have substantially the same size as the surface acoustic wave element 1, and is cut out in the portion corresponding to the oscillation transmitting area, including the comb electrode 2, of the functional surface 1a of the surface acoustic wave element 1. Thus the resin sheet is previously formed into a shape hollowed in the above portion.

In a mounting step (step S5), the surface acoustic wave element 1 is mounted on the circuit board 6 such that the surface acoustic wave element 1 is positioned to face the mount surface 6a of the circuit board 6 with the functional surface 1a directed downward, and the metal bumps 5 on the surface acoustic wave element 1 are aligned with the board pads 7 on the circuit board 6. Further, the assembly is subjected to pressure and heating while the metal bumps 5 and the board pads 7 are held in contact with each other. The anisotropic conductive resin 8 is thereby cured to bond the surface acoustic wave element 1 and the circuit board 6 together. With the above steps, the mounting structure of the surface acoustic wave element shown in FIG. 3 can be obtained.

Figure 5:
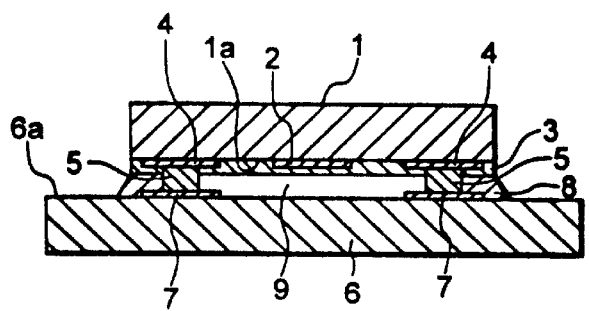
FIG. 5 is a sectional view of a mounting structure of a surface acoustic wave element according to a second embodiment of the present invention.

FIG. 5 is a sectional view of a mounting structure of a surface acoustic wave element according to a second embodiment of the present invention. Referring to FIG. 5, this second embodiment is the same as the above first embodiment in that the anisotropic conductive resin 8 is in the form of a continuous frame surrounding the oscillation space 9, but differs from the above first embodiment in that the anisotropic conductive resin 8 does not cover the peripheries of the metal bumps 5. Thus, in this embodiment, the metal bumps 5 directly contact the board pads 7 on the circuit board 6.

This embodiment is applied to, for example, the case of providing a small difference in coefficient of thermal expansion between the surface acoustic wave element 1 and the circuit board 6 and causing small stress to be produced in joint portions of the metal bumps 5.

Figure 6:
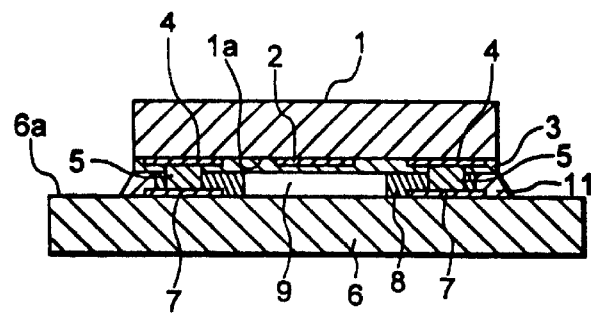
FIG. 6 is a sectional view of a mounting structure of a surface acoustic wave element according to a third embodiment of the present invention.

FIG. 6 is a sectional view of a mounting structure of a surface acoustic wave element according to a third embodiment of the present invention. Referring to FIG. 6, in this third embodiment, a second resin 11 further covers surroundings of the anisotropic conductive resin 8 which fills the gap between the surface acoustic wave element 1 and the circuit board 6. Any of insulating resins and conductive resins can be employed as the second resin 11.

This embodiment can be implemented in several forms. In one form, a layer of the second resin 11 is formed only in the gap between the surface acoustic wave element 1 and the circuit board 6. In another form, the resin layer is formed to cover the side of the surface acoustic wave element 1 as well. In still another form, the resin layer is formed to cover a part or the whole of the backside of the second resin 11 serves to improve resistance against moisture tending to intrude the oscillation space 9 and the surface of the comb electrode 2.

As is seen from FIG. 6, the illustrated embodiment represents the form in which the layer of the second resin 11 is formed only in the gap between the surface acoustic wave element 1 and the circuit board 6.

In the form in which the second resin 11 covers a part or the whole of the backside of the surface acoustic wave element 1 as well, the following advantage is obtained. If the second resin 11 is a conductive resin and a conductive layer is formed on the backside of the surface acoustic wave element 1, electrical connection is established between the backside of the surface acoustic wave element 1 and any desired circuit portion of the circuit board 6. As a result, the backside of the surface acoustic wave element 1 can be held at any desired potential.

Figure 7:
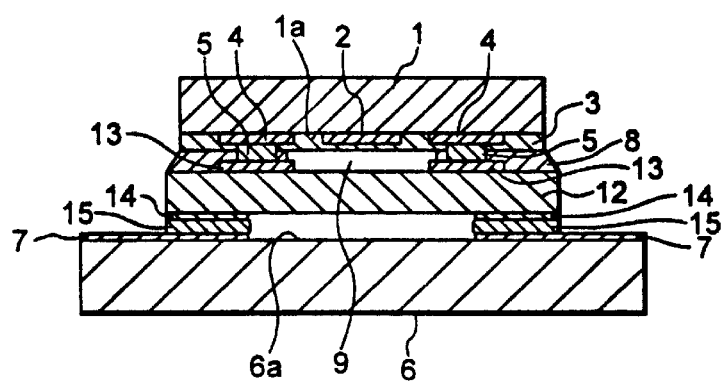
FIG. 7 is a sectional view of a mounting structure of a surface acoustic wave element according to a fourth embodiment of the present invention.

FIG. 7 is a sectional view of a mounting structure of a surface acoustic wave element according to a fourth embodiment of the present invention. Referring to FIG. 7, in this fourth embodiment, the surface acoustic wave element 1 is mounted on a carrier board 12 having a size substantially equal to that of the surface acoustic wave element 1. The connecting pads 4 on the surface acoustic wave element 1 are electrically connected to carrier board pads 13 on the carrier board 12 through the metal bumps 5 and conductive particles (not shown) contained in the anisotropic conductive resin 8. A gap between the surface acoustic wave element 1 and the carrier board 12 is filled by the anisotropic conductive resin 8 to ensure the oscillation space 9.

The surface acoustic wave element 1 and the carrier board 12 have substantially the same outer shapes, and constitute an ultra-compact package.

The carrier board 12 is connected to the board pads 7 on the circuit board 6 through solder bumps 15 with the aid of carrier board outer pads 14. While the carrier board 12 is connected to the circuit board 6 through only the solder bumps 15 in the illustrated embodiment, a resin may be filled in a gap between the carrier board 12 and the circuit board 6. Filling a resin in the gap improves reliability of the connection established by the solder bumps 15.

In FIG. 7 showing the fourth embodiment, one kind of resin, i.e., the anisotropic conductive resin 8, fills the gap between the surface acoustic wave element 1 and the carrier board 12. However, an ultra-compact package can also be obtained by filling the above gap with two or more kinds of resins in a manner similar to that shown in FIG. 6 showing the third embodiment.

In FIGS. 6 and 7 showing respectively the third and fourth embodiments, the peripheries of the metal bumps 5 are covered by the anisotropic conductive resin 8 and the second resin 11. However, it is apparent that the third and fourth embodiments may be modified so that the peripheries of the metal bumps 5 are not covered by any resin as in the second embodiment.

A concrete example of the mounting structure of the surface acoustic wave element according to the first embodiment of the present invention, shown in FIG. 3, will be described below in more detail with reference to the drawing.

The comb electrode 2 is formed by Al wiring on the functional surface 1a of the surface acoustic wave element 1, and a $SiO_2$ film is formed as the protective film 3 on the functional surface 1a at a thickness ranging from 0.01 to 0.2 $\mu$m. Au bumps are formed as the metal bumps 5 by wire bonding on the connecting pads 4 which function as input/output terminals and a ground terminal on the functional surface 1a of the surface acoustic wave element 1. The $SiO_2$ film (protective film) 3 may be formed over only the comb electrode 2 or over the entire functional surface 1a, except for the areas where the Au bumps (metal bumps) are to be formed.

The anisotropic conductive resin 8 fills the gap between the functional surface 1a of the surface acoustic wave element 1 and the mount surface 6a of a glass-fiber reinforced epoxy resin board as the circuit board 6. The anisotropic conductive resin 8 is previously formed into such a shape as to leave a space near the oscillation transmitting area, including the comb electrode 2, of the functional surface 1a of the surface acoustic wave element 1. That space serves as the oscillation space 9 to ensure characteristics of the surface acoustic wave element 1.

The surface acoustic wave element 1 is disposed with the functional surface 1a facing the mount surface 6a of the glass-fiber reinforced epoxy resin board 6, and is electrically connected to the board pads 7 on the mount surface 6a of the glass-fiber reinforced epoxy resin board 6 through the Au bumps 5 and Au particles (not shown) contained in the anisotropic conductive resin 8.

The anisotropic conductive resin 8 is in the form of a continuous frame surrounding the oscillation space 9 and holds the surface acoustic wave element 1 and the circuit board 6. Also, the anisotropic conductive resin 8 covers the peripheries of the Au bumps 5.

Examples of the anisotropic conductive resin 8 used in the present invention may contain Ni particles, metal-plated plastic particles, etc., dispersed in a resin matrix, other than the Au particles as described above.

The comb electrode 2 and the connecting pads 4 are preferably made of Al, which is inexpensive, and can easily provide characteristics of the surface acoustic wave element 1, but may be formed of any other suitable conductive material.

The thickness of the $SiO_2$ film 3 in excess of 0.02 $\mu$m is usually sufficient. A film of Si, SiN or the like can also be employed instead of the $SiO_2$ film.

The circuit board 6 may be formed of a ceramic board, a glass board, a flexible board or the like instead of the glass-fiber reinforced epoxy resin board.

The mounting method of the surface acoustic wave element according to the present invention, shown in FIG. 4, will be described below in more detail with reference to FIG. 4.

First, a $SiO_2$ film is formed as the protective film 3 on the functional surface 1a of the surface acoustic wave element 1 in the form of a wafer, except for on the connecting pads 4 (step S1). Then, Au bumps are formed as the metal bumps 5 on the connecting pads 4 by wire bonding (step S2).

Next, the surface acoustic wave element 1 in the form of a wafer is subjected to dicing for separation into individual chips (step S3).

Subsequently, a sheet of the anisotropic conductive resin 8 is adhered onto the mount surface 6a of the circuit board 6 (step S4). The sheet of the anisotropic conductive resin 8 is machined to have substantially the same size as the surface acoustic wave element 1, and is previously cut out to have a hollowed shape in its portion where the oscillation space 9 is to be formed.

In a mounting step (step S5), the surface acoustic wave element 1 is mounted on the glass-fiber reinforced epoxy resin board 6 so that the surface acoustic wave element 1 is positioned to face the mount surface 6a of the glass-fiber reinforced epoxy resin board 6 with the functional surface 1a directed downward, and the Au bumps 5 on the surface acoustic wave element 1 are aligned with the board pads 7 on the glass-fiber reinforced epoxy resin board 6. At this time, the surface acoustic wave element 1 is mounted under process in the range of 30 to 150 g per an Au bump 5 and is heated to 150° C. or more while the Au bumps 5 and the board pads 7 are held in contact with each other. The anisotropic conductive resin 8 is thereby cured to bond the surface acoustic wave element 1 and the circuit board 6 together.

Additionally, the Au bumps 5 are leveled to be even in height, if necessary, prior to the mounting step. Also, the anisotropic conductive resin 8 preferably hat almost the same height as that of the Au bumps 5 after the mounting step.

A first advantage of the mounting structure of the surface acoustic wave element according to the present invention is that the size occupied by the mounting structure can be reduced to almost the same size as the surface acoustic wave element itself.

The reason for this is that the oscillation space is formed by the anisotropic conductive resin, and the anisotropic conductive resin fills only the gap between the functional surface of the surface acoustic wave element and the mount surface of the circuit board in a condition in which the oscillation space is maintained. As a result, a more compact mounting structure can be achieved without affecting characteristics of the surface acoustic wave element.

A second advantage of the mounting structure of the surface acoustic wave element according to the present invention is that even when an inexpensive board, e.g., a glass-fiber reinforced epoxy resin board, is employed as the circuit board, a required level of reliability can be provided.

The reason is that since the oscillation space is formed by the anisotropic conductive resin interposed between the functional surface of the surface acoustic wave element and the mount surface of the circuit board, adverse effects by external dust, etc., can be avoided and problems such as electrode corrosion due to intrusion of moisture, etc., can also be avoided.

Another reason follows. Particularly in the case in which the anisotropic conductive resin is disposed so as to cover the peripheries of the metal bumps connecting the surface acoustic wave element and the circuit board, the joint portions of the metal bumps are kept from being directly subjected to stress produced due to a difference in coefficient of thermal expansion between the surface acoustic wave element and the circuit board. Thus fatigue failure of the metal bumps can be avoided.

What is claimed is:

1. A mounting method of a surface acoustic wave element in which a functional surface of said surface acoustic wave element is disposed to face a mount surface of a circuit board on which said surface acoustic wave element is to be mounted, and a gap between said functional surface and said mount surface is sealed off by a resin while an oscillation space is maintained between an oscillation transmitting area of said functional surface and said mount surface, said method comprising the steps of:

placing an anisotropic conductive resin on said mount surface of said circuit board, said anisotropic conductive resin having a space serving as said oscillation space;

positioning said functional surface of said surface acoustic wave element to face said mount surface of said circuit board in aligned relation; and connecting said surface acoustic wave element and said circuit board by heating said surface acoustic wave element to cure said anisotropic conductive resin while said surface acoustic wave element is pressed against said mount surface of said circuit board under pressure.

* * * * *